US012705409B2

(12) United States Patent
Butterfoss et al.

(10) Patent No.: US 12,705,409 B2
(45) Date of Patent: Aug. 11, 2026

(54) AUTOMATIC SIMULATION GENERATION

(71) Applicant: X Development LLC, Mountain View, CA (US)

(72) Inventors: Ryan Butterfoss, San Francisco, CA (US); David Andre, San Francisco, CA (US); Salil Vijaykumar Pradhan, San Jose, CA (US); Rebecca Radkoff, San Francisco, CA (US)

(73) Assignee: X Development LLC, Mountain View, CA (US)

(*) Notice: Subject to any disclaimer, the term of this patent is extended or adjusted under 35 U.S.C. 154(b) by 967 days.

(21) Appl. No.: 18/047,510

(22) Filed: Oct. 18, 2022

(65) Prior Publication Data

US 2023/0117297 A1 Apr. 20, 2023

Related U.S. Application Data

(60) Provisional application No. 63/257,351, filed on Oct. 19, 2021.

(51) Int. Cl.
*G06F 7/48* (2006.01)
*G06F 30/27* (2020.01)
*G06Q 10/067* (2023.01)
*G06Q 10/08* (2023.01)

(52) U.S. Cl.
CPC ........... *G06F 30/27* (2020.01); *G06Q 10/067* (2013.01); *G06Q 10/08* (2013.01)

(58) Field of Classification Search
CPC ...... G06F 30/27; G06Q 10/04; G06Q 10/067; G06Q 10/08; G06Q 10/083
See application file for complete search history.

(56) References Cited

U.S. PATENT DOCUMENTS

2006/0085323 A1* 4/2006 Matty .................... G06Q 10/04 705/38
2008/0306783 A1* 12/2008 Yee .................... G06Q 10/0639
2010/0125486 A1* 5/2010 Sinclair .............. G06Q 30/0202 705/7.31
2015/0109287 A1 4/2015 Grichnik et al.
(Continued)

OTHER PUBLICATIONS

Llamasoft.com [online], "Supply Chain GuruTM—Supply Chain Optimization + Simulation," available on or before Sep. 15, 2008, via Internet Archive: Wayback Machine URL <http://web.archive.org/web/20080915104910/http://www.llamasoft.com/guru.html>, 3 pages.

(Continued)

*Primary Examiner* — Nithya J. Moll
(74) *Attorney, Agent, or Firm* — Fish & Richardson P.C.

(57) ABSTRACT

Methods, systems, and apparatus, including computer programs encoded on a computer storage medium, for automatic generation of a supply chain simulation. The methods, systems, and apparatus include actions of obtaining supply chain data of a supply chain, generating a supply chain network graph that represents relationships between locations indicated by the supply chain data, determining classifications of the locations indicated by the supply chain data, determining agent rule models based on the supply chain data, and generating a supply chain simulation based on the supply chain network graph, the classifications of the locations, and the agent rule models.

14 Claims, 4 Drawing Sheets

(56) References Cited

U.S. PATENT DOCUMENTS

| | | | | |
|---|---|---|---|---|
| 2017/0262764 | A1* | 9/2017 | Karuppasamy ........ | G06N 5/025 |
| 2017/0332544 | A1 | 11/2017 | Conrad et al. | |
| 2019/0244150 | A1 | 8/2019 | Furman et al. | |
| 2021/0374640 | A1* | 12/2021 | Khan ..................... | G06V 20/00 |

OTHER PUBLICATIONS

International Search Report and Written Opinion in International Appln. No. PCT/US2022/046943, dated Feb. 17, 2023, 14 pages.

Office Action in Korean Appln. No. 2024-7016279, mailed on Feb. 26, 2026, 16 pages (with English translation).

* cited by examiner

AUTOMATIC SIMULATION GENERATION

CROSS-REFERENCE TO RELATED APPLICATIONS

This application claims priority under 35 U.S.C. 119(e) to U.S. Provisional Patent Application No. 63/257,351, filed on Oct. 19, 2021, entitled AUTOMATIC SIMULATION GENERATION. The entirety of the provisional application is herein incorporated by reference.

TECHNICAL FIELD

This disclosure generally relates to computer simulations.

BACKGROUND

Large simulations of agent-based supply chain networks are often difficult to construct because of a large number of rules and constraints used to accurately reflect the complexity of the interaction between agents and modeling the rules that drive them. The rules and constraints may be hand coded, with the peculiarities and deviations of specific locations and agents either being ignored for the sake of uniformity or tediously added per process.

SUMMARY

In general, an aspect of the subject matter described in this specification relates to automatically generating a supply chain simulation. Simulation of supply chains allows efficient planning and replanning of supply chain layout and operation to aid in building a flexible and resilient network. Simulations that more accurately reflect real world behavior of actual and synthetic agents in the system can provide simulated results that are more likely to reflect real world results.

Given the role that simulation plays, quickly building and executing a supply chain simulation with less effort may help run and grow a business. Taking many hours of dedicated engineering time to build out a simulation may make the costs of scaling the business uneconomical.

In some aspects, the subject matter described in this specification may be embodied in methods that may include the actions of obtaining supply chain data of a supply chain, generating a supply chain network graph that represents relationships between locations indicated by the supply chain data, determining classifications of the locations indicated by the supply chain data, determining agent rule models based on the supply chain data, and generating a supply chain simulation based on the supply chain network graph, the classifications of the locations, and the agent rule models.

Particular embodiments of the subject matter described in this specification can be implemented so as to realize one or more of the following advantages. The techniques described in this specification can allow users to quickly build and execute simulations on historical data. Traditionally, building supply chain simulations requires many hours of dedicated and expensive engineering time. However, this amount of effort is infeasible for many entities that lack the required engineering or computing resources. By using the techniques described below, users can create sophisticated supply chain simulations using only historical data and natural language inputs. The system can automatically generate simulation constraints and agent rules that accurately model both the historical data and hypothetical changes to the supply chain structure and operation. Users also have the ability to input counter-factual data and future conditions that would be impossible, impractical, or prohibitively expensive to evaluate in the real-world. These techniques provide for quickly and easily accessing very powerful simulation insights, which can have significant real-world impacts. For example, using the techniques described in this specification, entities can build supply chains that are more efficient and more robust even in the face of real world disruptions. These improvements can all be gained without potentially dangerous experimentation on existing supply chain structures. Additionally, the techniques described below allow users to search a space of existing or hypothetical supply chains in order to identify an arrangement that provides the best performance according to an appropriate performance metric. This new capability allows users to quickly and easily optimize their supply chain across a range of possibilities, from expected disturbances and fluctuations to the seemingly highly unlikely scenarios.

The details of one or more implementations are set forth in the accompanying drawings and the description, below. Other potential features and advantages of the disclosure will be apparent from the description and drawings, and from the claims.

BRIEF DESCRIPTION OF THE DRAWINGS

Like reference symbols in the various drawings indicate like elements.

DETAILED DESCRIPTION

Figure 1:
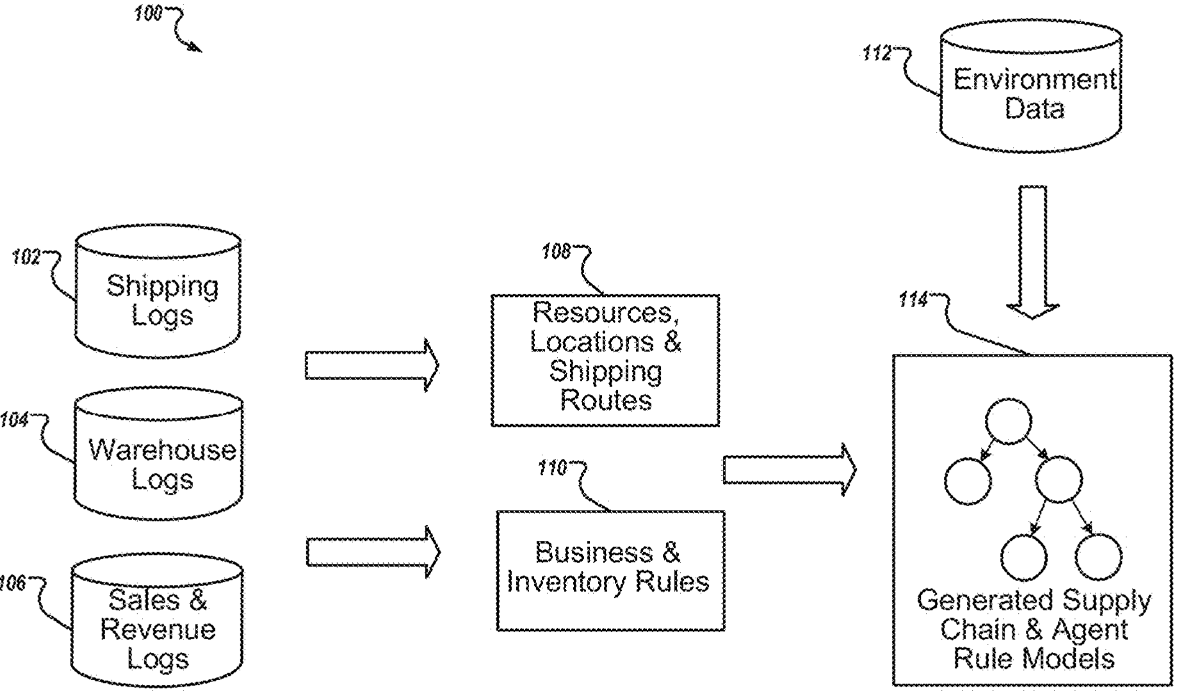
FIG. 1 illustrates a block diagram of an example system that automatically generates a supply chain simulation.

FIG. 1 illustrates a block diagram of an example system 100 that can automatically generate a supply chain simulation. The system 100 can include one or more data stores 102, 104, and 106 that store supply chain data and one or more processors that automatically generate a supply chain simulation from the supply chain data. For example, a server or a distributed server system can receive supply chain data in the form of multiple tables stored in multiple data stores, and can then automatically generate a supply chain simulation from the supply chain data. The system 100 can include data stores reflecting shipping logs 102, warehouse logs 104, sales and revenue logs 106, and environment data 112. From these logs, the system 100 can automatically generate information about the supply chain, including shipping data 108 that represents resources used, e.g., shipping and warehousing companies and vehicles used, locations involved, and shipping routes; and also including inventory data 110, which can include data that represents business rules and inventory rules 110, e.g., at what inventory level are new items manufactured or ordered.

The supply chain data stored in the logs 102, 104, and 106 can be historical data detailing the movement of goods through the actual supply chain, as well as historical data representing weather and traffic conditions. Data associated with weather, traffic, and other factors external to the supply chain may be referred to as environment data 112. The historical data can include, for example, one or more of (i)

ordering information detailing the requests for goods from downstream network agents, (ii) warehouse management system data detailing the movement of goods through the warehouse, (iii) shipping data detailing each shipment of data including method of transport, time elapsed, and cost, (iv) beacon data indicating progress of shipments as the shipments move from point to point, e.g., trucking data, (v) stop data for truck routes that involve multiple locations, (vi) loading/unloading times for goods (e.g., truck arrival time vs. truck being declared unloaded), (vii) customs clearance data for goods crossing international borders, (viii) stock keeping unit (SKU catalog information including types and weight of material, (ix) weather data for locations and routes indicated in shipping data, (x) traffic data for routes indicated in shipping data, and (xi) classifications for logistics information including type and ownership of freight carriers, and contractual information for warehouses.

The system 100 can generate a supply chain representation 114, including a supply chain network graph and agent rule models based on the logs 102, 104, and 106; shipping data 108 and inventory data 110; and the environment data 112. The system 100 can use shipping logs 102, warehouse logs 104, sales and revenue data 106, and shipping data 108 to determine the nodes and edges of the supply chain network graph. Each node can represent a shipping origin, destination or both, which in turn can be a supplier, factory, warehouse, distribution center, retailer, last mile shipping node, etc. The system can also use the logs to generate the inventory data 110.

The exact classification of a node in the supply chain grain can depend on the pattern of shipping/receiving at that location and type of material being sent/received. The system 100 can determine a classification with a machine-learning classifier that is trained on a large amount of shipping data on labeled networks. Each edge can represent relationships between nodes. For example, each edge can represent a route that material travels along between two locations.

The system 100 can determine agent rule models from the logs 102, 104, and 106, as well as the shipping data 108 and inventory data 110. Each agent rule model is a separately generated machine learning model that is trained to generate predictions representing the behavior, or range or distribution of behaviors, of one aspect of the supply chain during its operation, as represented in the logs. The identity of the "agent" is thus context dependent and can represent an entity placing an order, a shipping company transporting a shipment, or a factory producing an item or a batch of items, to name just a few examples. For example, the system can generate distinct machine learned agent rule models that generate predictions regarding when an agent can move, how long a route will take, what allowable windows trucks can be loaded/unloaded, a range of product amounts shippable at any one time via particular modes, or types of products shipped together, to name just a few examples. The agent rule models can operate within given constraints, which can be learned or specified separately. For example, agent rule model constraints for a truck or shipping route can be: an unloading time constraint that specifies the truck would need to wait a 1-4 hour block of time for unloading, a requirement that the truck must visit facility "A" if it is ultimately destined for facility "B", or that route "X" is expected to take, on average, 5 hours to complete.

In another example, constraints used by the agent rule models can include one or more of specific hours that retail stores can receive shipments, warehouse requirements for time to load/unload trucks, variances based on the type of material being transported (palletized vs bulk, weight restrictions on where things can be stored, etc.), variances based on weather conditions, times to deal with clearing customs for different port nationalities, truck routes that avoid rush hour or other high traffic conditions, restrictions on when/how certain materials can be transported, certain types of SKUs that can only be transported to specific regions, and certain warehouses that are not equipped to handle certain materials.

The system 100 can generate the above-mentioned supply chain data both from a combination of machine learning trained functions, that can examine shipping times to produce warehouse hours and estimated unloading times, and functions trained on routes and predicted traffic patterns. Additionally, the system 100 can use inventory analysis from warehouse management software to produce realistic patterns of the various types of SKUs moved on a typical day.

Figure 2:
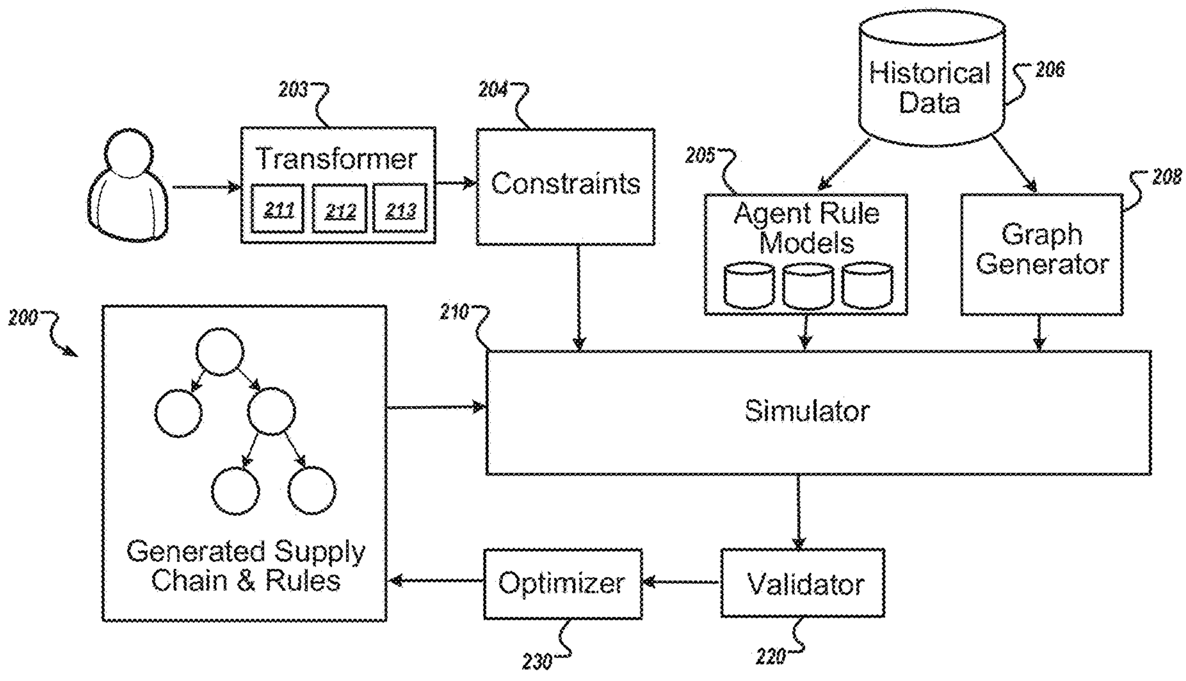
FIG. 2 illustrates a block diagram of an example system that optimizes a supply chain simulation.

FIG. 2 illustrates a block diagram of an example system 200 that can automatically generate a supply chain simulation. The system 200 includes one or more transformers 203, a collection of constraints 204, agent rule models 205, historical data 206, a supply chain network graph generator 208, a simulator 210, a validator 220, and an optimizer 230.

As one example, a user associated with an entity having an established supply chain may want to test variations on the existing supply chain network before actually implementing variations in the real world. Using the techniques described in this specification, a user can efficiently incorporate variations into a supply chain simulation through the use of natural language inputs. In some implementations, the system 200 supports the input of variations using natural language to specify the constraints required to simulate that variation.

For example, a user can specify "packages must arrive to our New York facility by Thursdays." In this case, the natural language input represents a collection of real-world constraints that must be applied to the simulator 210 in order to render a sufficiently accurate simulation. Other representative examples of natural language input could be the user specifying the means by which a package must be delivered, a quantity of materials needed by a certain date, or a deadline that must be met. Additionally, the user can specify a natural language input designed to mimic the constraints of a competitor or partner network, for evaluation in the current network simulation.

In order for the simulator 210 to understand the user natural language input, the input can be processed by a machine learning model, e.g., a transformer 203, that transforms the natural language input into a constraint language. In some implementations, the transformer 203 is used to process the user natural language input into a collection of constraints 204. A transformer is an example of a Natural Language Processor (NLP) designed to convert high-dimensional embeddings (for example, words or word fragments) into data that can be understood for downstream tasks. For example, the transformer 203 can process natural language input to generate transformed data that represents supply chain symbolic states, a required pathway, or a new network structure to be added to a simulation. Data transformed by the transformer can be used to form the basis for the collection of constraints 204 that will be applied to the simulation.

In some implementations, the transformer 203 contains an initial layer with a multi-head self-attention unit 211 which allows word embeddings to interact with one another. In this case, the input to the transformer 203 can be a matrix of "X"

dimensional word embeddings for each of "Y" input "tokens", where the tokens can represent words, or word fragments, of the natural language constraints. This matrix can then be passed to a series of transformation layers within the transformer 203. In some implementations, the transformer 203 can undergo an initial training phase to familiarize the system with an available collection of tokens. In some implementations, the transformer is based on a very large language model, for example, one that encodes data for billions of token-to-word possibilities.

In some implementations, the transformer 203 includes a tuning layer 212. A tuning layer 212 can be added to a transformer 203 to specialize the transformer 203 to perform a particular task. For example, a word-classification tuning layer 212 can be added to the transformer 203 to enable named-entity recognition. In this example, the transformer 203 first determines the entity type of each word. These entities can include, for example, a location, time, parcel, or method of transportation, among other things. In some implementations, further training can be conducted with the transformer 203 to reinforce these entity-to-word relationships. Once the appropriate entity type for a word is determined, the tuning layer 212 can assign a vector to each entity. For example, where "K" defines a location, an entity determined to be a location can be assigned the vector "K×1." The entity vectors can then be passed to a softmax function which creates probabilities for each class of entity. In some implementations, entities can then be assigned to words based on an estimated mean error. Other implementations can choose to use other probabilistic functions or metrics.

In some implementations, the transformation layers of the transformer 203 include an encoder and decoder. This arrangement can collectively be referred to as an encoder-decoder model 213. The encoder-decoder model 213 first transforms the received text matrix into representations and generates new tokens for the words, or word fragments. This process converts the text string from one language (e.g. "natural language") to another (e.g. "constraint language"). This conversion process generates the collection of constraints 204 to be used by the simulator 210.

Examples of these constraints 204 could be "package A must be moved in a refrigerated vehicle", "process X must have a carbon cost below Y", "facility B must receive package A by this time", or "package A must spend no more than two days on this particular route." Additionally, these constraints 204 can be used to form the basis of a network for subsequent simulations. For example, if a constraint 204 requires that package "A" must be processed through facilities "B" and "C" before proceeding to "D", this constraint can be applied to future simulations. In some implementations, the collection of constraints 204 will be balanced by the simulator 210 to achieve a "best fit" between all of the identified constraints.

In addition to processing the natural language inputs with a transformer 203, the system 200 can also use a collection of other machine learning techniques to automatically enhance the realism and accuracy of the similar. For example, the agent rule models 205 can be generated from supply chain historical data 206 and can, for example, define the behavior of the agent during its operation in the simulation. The agent rule models 205 can be a collection of agent rule models, each one defining a different behavior of an agent acting in the supply chain.

In some implementations, the supply chain historical data 206 can also be used to generate a graph of the existing supply chain network to provide to the simulator 210. This process is performed by a graph generator 208. This graph may represent a shipping origin, destination, or both, which in turn can be a supplier, factory, warehouse, distribution center, retailer, or last mile shipping node, among other things.

The simulator 210 can apply the generated supply chain network graph 208, agent rule models 205, and collection of constraints 204 to historical terms to generate a supply chain simulation, and the validator 220 may determine how close the supply chain simulation matches reality. The validator 220 may validate that the supply chain simulation matches the output or demand of the actual data in order to drive the actual supply chain accordingly. For example, in a simulation of a supplier-distributor-retailer graph, the simulation may be run with each retail outlet replicating the actual starting inventory and daily sales numbers from the given data. Replicating with the actual data may produce an accurate simulation on the supplier and distributor end of the network.

The manufacturing end of the supply chain may include models of the factory, the raw/partial materials moving into the factory, and the finished/partially finished goods being transported out. Each factory model may have a representative production capacity and associated error rates and starting inventory for materials. As goods are produced and materials consumed during that product, inventory and output levels may be measured by the validator 220 against their real world counterparts.

In some implementations, the simulator 210 may ignore certain aspects of the historical data 206 (either represented by the agent rule models 205 or supply chain graph generator 208) in order to meet the collection of constraints 204 identified from the natural language input. One of the benefits of this aspect is that the simulator 210 may propose solutions to problems that had not been previously considered by the user. For example, if a certain package "X" has historically been delivered with trucks from company "A", the simulation may propose delivering package "X" with trucks from company "B", provided that doing so satisfies the given collection of constraints 204. Additionally, this feedback may present more complex solutions to supply chain issues, for example, proposing alternative contracting mechanisms that had not historically been considered. An example of a more complex recommendation of this nature may be the simulator 210 proposing to shift the delivery of a certain good to a "gig-based" system, when it had historically been delivered under a fixed contract with a vendor.

The simulator 210 can allow a user to search through a space of possible, existing, or hypothetical simulations by repeatedly varying one or more parameters of the supply chain simulations. The simulations can include simulations currently generated by the simulator 210, previous simulations of the user network, or simulations of rival or competing networks. In some implementations, the user can specify performance metrics with which to evaluate the quality of a particular supply chain network. Example performance metrics can include a cost, time, inventory, fragility, or carbon cost of a supply chain network. For example, the fragility metric for a supply chain network can represent how resistant a network is to the loss of a certain facility or route. Thus, to compute a value for the fragility network, a user can define multiple simulations that specify the loss of facilities or routes, a measure of a penalty or cost associated with such losses, and aggregate the measure of penalties or losses to determine which supply chain network was the most robust to disruptions.

Once the simulation is set up and run, the validator 220 may run various analysis techniques against the record of the simulated supply chain and the data from the actual supply chain. The data analyzed may include one or more of types of orders placed by various agents, amounts of inventory moved and inventory on hand at each location, number of shipments sent, costs and times of deliveries, utilization rates of various logistics resources (trucks, warehouse space, etc.), production rates of goods, utilization of raw materials, power and fuel consumption, and packaging material stock.

The validator 220 may compare the variance of the simulated data and the actual data, and use the comparison to further tune the simulation. For instance, if a term, for probability of an item being ordered given a supply level, is inferred from ordering data but the simulation proves to have too many of these items ordered, the optimization (or fitting) process may utilize the new data, the variance produced from the current simulation parameters, and find a new set of parameters to describe the simulation such that the new real world data is taken into account. The validator 220 may tune the simulation in a continuous and "always on" process as new data is received so overtime the simulation may come to match the real world data as closely as possible.

The validator 220 may apply the same techniques of adjusting event probability to other areas. In a first area, logistics, the validator 220 may adjust shipping time for goods on established routes (truck, sea, air) to match expected and actual arrival times. In a second area, the validator 220 may adjust port and warehouse load/unload times for real world behaviors and conditions, such as taking weather, the time and date into account. For example, a particular warehouse might run slower on the weekends vs. weekdays, or need to account for externalities like higher usage rates during holiday season. In a third area, manufacturing, the output of the factory may adjust based on the type of good being produced and the amount requested. For example, a more complicated consumer good with more parts or difficult manufacturing processes might require more steps, machinery, or employees to use.

The simulation can adjust based on actual usage rates and knowledge of the goods being produced to accurately predict the output rate for a factory given a new type of product based on its materials and assembly/manufacturing process. This closed loop tuning may ultimately serve to produce as accurate a simulation as possible to the given data.

Figure 3:
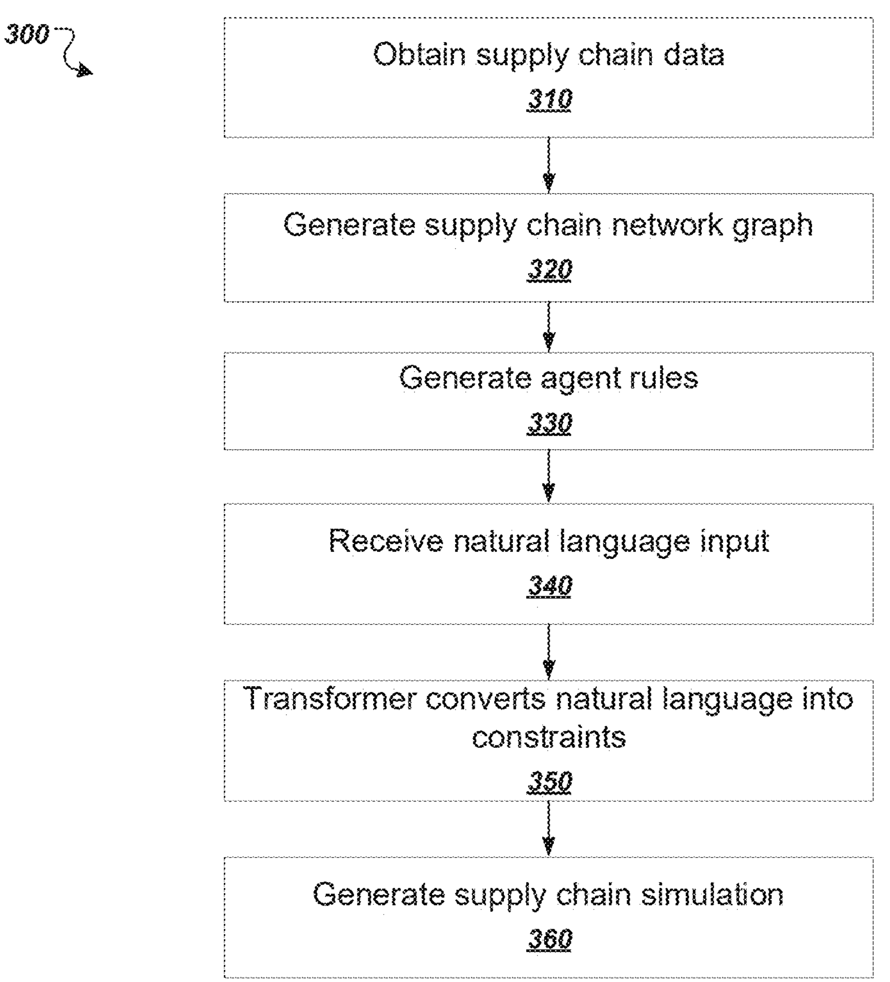
FIG. 3 illustrates a process for optimizing a supply chain simulation.

FIG. 3 illustrates a process 300 for optimizing a supply chain simulation. This process 300 includes obtaining supply chain data 310, generating a supply chain network graph 320, generating agent rule models 330, providing a natural language input 340, converting the natural language input into a collection of constraints 350, and generating a supply chain simulation 360. While steps 320 (generating a graph), 330 (generating agent rule models), and 350 (generating a collection of constraints) have been shown in succession, these steps may be performed in any order provided that the necessary data has been provided.

In some implementations, obtaining supply chain data 310 can include obtaining historical data detailing the movement of goods through the actual supply chain, as well as historical data for weather and traffic. For example, this historical data can include one or more of (i) ordering information detailing the requests for goods from downstream network agents, (ii) warehouse management system data detailing the movement of goods through the warehouse, (iii) shipping data detailing each shipment of data including method of transport, time elapsed, and cost, (iv) beacon data indicating progress of shipments as the shipments move from point to point, e.g., trucking data, (v) stop data for truck routes that involve multiple locations, (vi) loading/unloading times for goods (e.g., truck arrival time vs. truck being declared unloaded), (vii) customs clearance data for goods crossing international borders, (viii) stock keeping unit (SKU catalog information including types and weight of material, (ix) weather data for locations and routes indicated in shipping data, (x) traffic data for routes indicated in shipping data, and (xi) classifications for logistics information including type and ownership of freight carriers, and contractual information for warehouses.

In some implementations, the historical data is then used to generate a supply chain network graph 320 based on the supply chain data. The process 300 can use shipping and location data, along with route information to infer the nodes and edges of the supply chain network graph. Each node can represent a shipping origin, destination or both, which in turn can be a supplier, factory, warehouse, distribution center, retailer, or last mile shipping node, among other things.

In some implementations, the historical data is also used to generate agent rule models 330. The process 300 can determine agent rule models from the supply chain data. The agent rule models define the behavior of the agent during its operation. The agent rule models can operate within given constraints. For example, agent rules for a truck can be: an unloading time constraint that specifies the truck would need to wait a 1-4 hour block of time for unloading, a requirement that the truck must visit facility "A" if it is ultimately destined for facility "B", or that route "X" is expected to take, on average, 5 hours to complete.

In some implementations, the process can also receive a natural language input 340. In some cases, this input can be provided vocally, through a standard "voice to text" conversion. Alternatively, the user can choose to provide the input in text form.

In some implementations, the natural language input is then converted into a collection of constraints 350. In order for the process 300 to understand the user natural language input, the input can be transformed from a space of "natural language" terms to a space of a "constraint language" whose terms represent supply chain constraints. For example, the transformed constraint language can include terms representing supply chain symbolic states, a required pathway, or a new network structure available to the simulation. Additionally, the natural language input can also specify ranges of possible options for a supply chain, such as a maximum number of trucks sharing a route, a number of warehouses, a percentage of warehouses available for rental, details of the likely markets for transport and storage options, options to open new warehouses or distribution centers, and other such things. The transformer model can then be configured to interpret ranges specified in natural language terms to ranges that are specified in a constraint language that can be ingested and used by the supply chain simulation.

In some implementations, following generation of the network graph, agent rule models, and collection of constraints, the process 300 can then generate one or more simulations reflecting the processed data 360.

Figure 4:
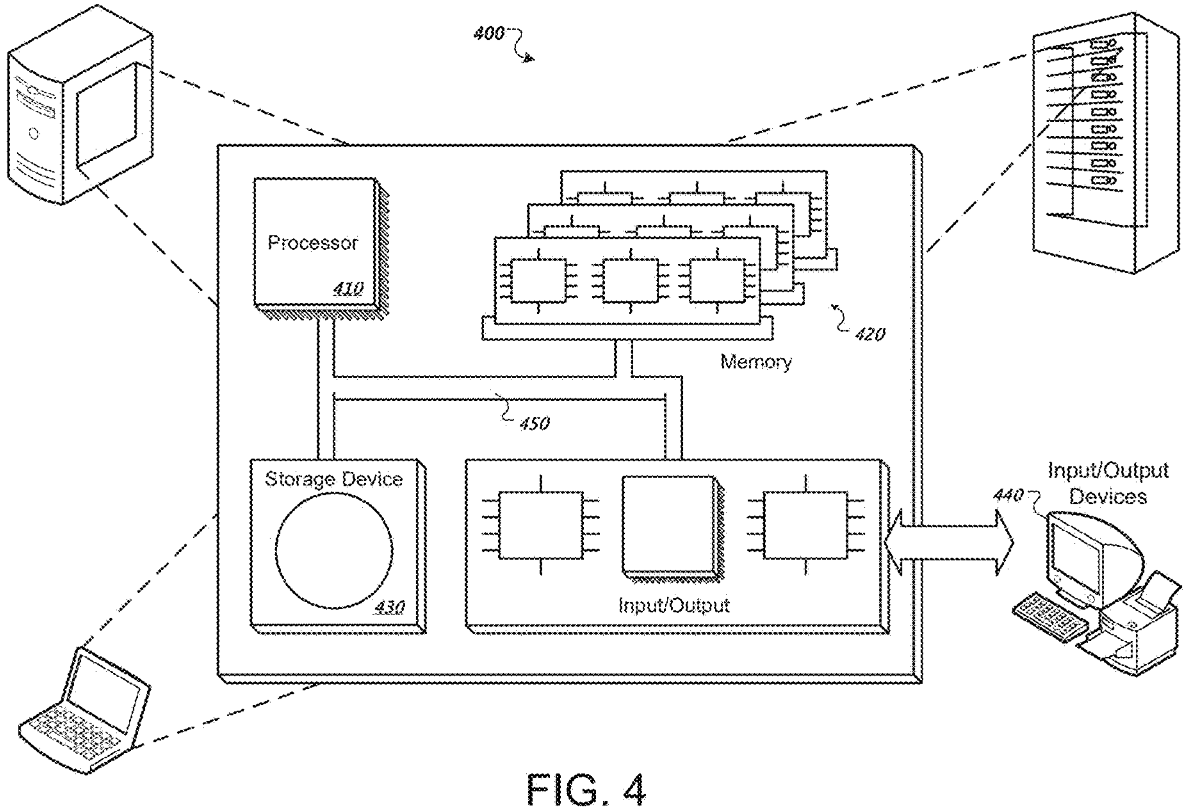
FIG. 4 illustrates a schematic diagram of an exemplary computer system.

FIG. 4 illustrates a schematic diagram of an exemplary computer system 400. The systems 100 and 200, and process 300, described above can be implemented on the system 400.

The system 400 includes a processor 410, a memory 420, a storage device 430, and an input/output device 440. Each of the components 410, 420, 430, and 440 are interconnected using a system bus. The processor 410 is capable of processing instructions for execution within the system 400. In one implementation, the processor 410 is a single-threaded processor. In another implementation, the processor 410 is a multi-threaded processor. The processor 410 is capable of processing instructions stored in the memory 420 or on the storage device 430 to display graphical information for a user interface on the input/output device 440.

The memory 420 stores information within the system 400. In one implementation, the memory 420 is a computer-readable medium. In one implementation, the memory 420 is a volatile memory unit. In another implementation, the memory 420 is a non-volatile memory unit.

The storage device 430 is capable of providing mass storage for the system 400. In one implementation, the storage device 430 is a computer-readable medium. In various different implementations, the storage device 430 may be a floppy disk device, a hard disk device, a solid state drive, an optical disk device, a tape device, universal serial bus stick, or some other storage device.

The input/output device 440 provides input/output operations for the system 400. In one implementation, the input/output device 440 includes a keyboard and/or pointing device. In another implementation, the input/output device 440 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

A computer program which may also be referred to or described as a program, software, a software application, an app, a module, a software module, a script, or code) can be written in any form of programming language, including compiled or interpreted languages, or declarative or procedural languages, and it can be deployed in any form, including as a stand-alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a data communication network.

For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a rail trackball by which the user can provide input to the computer.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computer system can include clients and servers. A client and server are generally remote from each other and typically interact through a network, such as the described one. The relationship of client and server arises by virtue of computer programs running on the respective computers and having a client-server relationship to each other. The servers may be part of a cloud, which may include ephemeral aspects.

In addition to the embodiments described above, the following embodiments are also innovative:

Embodiment 1 is a method comprising:

obtaining supply chain data of a supply chain;

generating a supply chain network graph that represents relationships between locations indicated by the supply chain data;

determining classifications of the locations indicated by the supply chain data;

determining agent rule models based on the supply chain data; and generating a supply chain simulation based on the supply chain network graph, the classifications of the locations, and the agent rules.

Embodiment 2 is method of embodiment 1, wherein generating the supply chain simulation comprises:

receiving a natural language user input specifying one or more constraints of the simulation; and generating the simulation according to the supply chain network graph, the classifications of the locations, and the agent rule models, and the one or more constraints.

Embodiment 3 is the method of embodiment 2, further comprising:

providing the natural language input as input to a trained transformer network that is configured to generate constraint representations from natural language inputs;

receiving, as output from the transformer network, one or more constraint representations for the natural language input.

Embodiment 4 is the method of embodiment 3, wherein the transformer network has a tuning layer that generates constraint representations from internal representations.

Embodiment 5 is the method of embodiment 2, wherein the user input specifies one or more parameters that were not reflected in the supply chain data, and further comprising:

using the existing supply chain data to estimate the one or more parameters that were not reflected in the supply chain data.

Embodiment 6 is the method of embodiment 2, wherein the natural language input specifies one or more aspects of a supply chain that were not reflected in the supply chain data.

Embodiment 7 is the method of embodiment 6, wherein the natural language input specifies an additional factory, warehouse, distribution center, or retail store that was not reflected in the supply chain data.

Embodiment 8 is the method of embodiment 6, wherein the natural language input specifies a range representing a number of possible factories, warehouses, distribution centers, or retail stores.

Embodiment 9 is the method of embodiment 6, further comprising repeatedly adjusting one or more parameters of the simulation and repeating the evaluation process for each different combination of parameters of the simulation; and generating an output identifying a combination of parameters having a highest scoring performance metric.

Embodiment 10 is the method of any one of embodiments 1-9, further comprising:

performing an evaluation process on the generated simulation and computing one or more performance metrics for the generated simulation.

Embodiment 11 is the method of embodiment 10, wherein the evaluation process and the generation of one or more performance metrics is performed for a plurality of generated simulations.

Embodiment 12 is the method of any one of embodiments 1-12, further comprising:

searching through a plurality of possible supply chain simulations for an optimization of one or more performance metrics.

Embodiment 13 is the method of embodiment 12, wherein the one or more performance metrics includes a cost, time, inventory, fragility, or carbon cost.

Embodiment 14 is a system comprising: one or more computers and one or more storage devices storing instructions that are operable, when executed by the one or more computers, to cause the one or more computers to perform the method of any one of embodiments 1 to 13.

Embodiment 15 is a computer storage medium encoded with a computer program, the program comprising instructions that are operable, when executed by data processing apparatus, to cause the data processing apparatus to perform the method of any one of embodiments 1 to 13.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. A computer-implemented method comprising:

obtaining supply chain data of a supply chain;

generating a supply chain network graph that represents relationships between locations indicated by the supply chain data;

determining classifications of the locations indicated by the supply chain data;

determining agent rule models based on the supply chain data; and generating a supply chain simulation based on the supply chain network graph, the classifications of the locations, and the agent rules, wherein generating the supply chain simulation comprises:

receiving a natural language user input specifying one or more constraints of the simulation;

providing the natural language input as input to a trained transformer network that is configured to generate constraint representations from natural language inputs, wherein the transformer network has a tuning layer that generates constraint representations from internal representations;

generating the simulation according to the supply chain network graph, the classifications of the locations, and the agent rule models, and the one or more constraints; and, receiving, as output from the transformer network, one or more constraint representations for the natural language input.

2. The method of claim 1, wherein the user input specifies one or more parameters that were not reflected in the supply chain data, and further comprising:

using the existing supply chain data to estimate the one or more parameters that were not reflected in the supply chain data.

3. The method of claim 1, wherein the natural language input specifies one or more aspects of a supply chain that were not reflected in the supply chain data.

4. The method of claim 3, wherein the natural language input specifies an additional factory, warehouse, distribution center, or retail store that was not reflected in the supply chain data.

5. The method of claim 3, wherein the natural language input specifies a range representing a number of possible factories, warehouses, distribution centers, or retail stores.

6. The method of claim 3, further comprising repeatedly adjusting one or more parameters of the simulation and repeating the evaluation process for each different combination of parameters of the simulation; and generating an output identifying a combination of parameters having a highest scoring performance metric.

7. The method of claim 1, further comprising:

performing an evaluation process on the generated simulation and computing one or more performance metrics for the generated simulation.

8. The method of claim 7, wherein the evaluation process and the generation of one or more performance metrics is performed for a plurality of generated simulations.

9. The method of claim 1, further comprising:

searching through a plurality of possible supply chain simulations for an optimization of one or more performance metrics.

10. The method of claim 9, wherein the one or more performance metrics includes a cost, time, inventory, fragility, or carbon cost.

11. A system comprising:

one or more computers and one or more storage devices storing instructions that are operable, when executed by the one or more computers, to cause the one or more computers to perform operations comprising:

obtaining supply chain data of a supply chain;

generating a supply chain network graph that represents relationships between locations indicated by the supply chain data;

determining classifications of the locations indicated by the supply chain data;

determining agent rule models based on the supply chain data; and generating a supply chain simulation based on the supply chain network graph, the classifications of the locations, and the agent rules; wherein generating the supply chain simulation comprises:

receiving a natural language user input specifying one or more constraints of the simulation;

providing the natural language input as input to a trained transformer network that is configured to generate constraint representations from natural language inputs, wherein the transformer network has a tuning layer that generates constraint representations from internal representations;

generating the simulation according to the supply chain network graph, the classifications of the locations, and the agent rule models, and the one or more constraints; and, receiving, as output from the transformer network, one or more constraint representations for the natural language input.

12. The system of claim 11, wherein the user input specifies one or more parameters that were not reflected in the supply chain data, and further comprising:

using the existing supply chain data to estimate the one or more parameters that were not reflected in the supply chain data.

13. The system of claim 11, wherein the natural language input specifies one or more aspects of a supply chain that were not reflected in the supply chain data.

14. One or more non-transitory computer storage media encoded with computer program instructions that when executed by one or more computers cause the one or more computers to perform operations comprising:

obtaining supply chain data of a supply chain;

generating a supply chain network graph that represents relationships between locations indicated by the supply chain data;

determining classifications of the locations indicated by the supply chain data;

determining agent rule models based on the supply chain data; and generating a supply chain simulation based on the supply chain network graph, the classifications of the locations, and the agent rules; wherein generating the supply chain simulation comprises:

receiving a natural language user input specifying one or more constraints of the simulation;

providing the natural language input as input to a trained transformer network that is configured to generate constraint representations from natural language inputs, wherein the transformer network has a tuning layer that generates constraint representations from internal representations;

generating the simulation according to the supply chain network graph, the classifications of the locations, and the agent rule models, and the one or more constraints; and, receiving, as output from the transformer network, one or more constraint representations for the natural language input.

* * * * *